United States Patent [19]

Tsang

[11] 3,792,319

[45] Feb. 12, 1974

[54] POLY-CRYSTALLINE SILICON FUSIBLE LINKS FOR PROGRAMMABLE READ-ONLY MEMORIES

[75] Inventor: Frederick Tsang, Santa Clara, Calif.

[73] Assignee: Intel Corporation, Santa Clara, Calif.

[22] Filed: Jan. 19, 1972

[21] Appl. No.: 218,988

[52] U.S. Cl........ 317/235 R, 317/234 J, 317/234 N, 317/235 D, 317/235 AT, 340/166

[51] Int. Cl.......................... H01l 11/00, H01l 15/00

[58] Field of Search........ 317/234, 5, 5.4, 235, 48.7, 317/22; 340/166

[56] References Cited

UNITED STATES PATENTS

| | | | |
|---|---|---|---|
| 3,699,395 | 10/1972 | Boleky | 317/235 D |
| 3,699,403 | 10/1972 | Boleky | 317/235 R |
| 3,028,659 | 4/1962 | Chow et al. | 317/234 |
| 3,191,151 | 6/1965 | Price | 340/166 |
| 3,555,365 | 1/1971 | Forlani et al. | 317/101 |
| 3,564,354 | 2/1971 | Aoki et al. | 317/235 |
| 3,570,114 | 3/1971 | Bean et al. | 317/235 |

*Primary Examiner*—John S. Heyman
*Assistant Examiner*—Andrew J. James
*Attorney, Agent, or Firm*—Spensley, Horn & Lubitz

[57] ABSTRACT

Programmable read-only circuits (e.g., memories) using doped polycrystalline silicon fusible links deposited to the top surface of an insulating (e.g., silicon oxide) layer over an integrated circuit and connected in circuit through windows in the insulating layer and/or by a metallization layer. The fusible link may be covered with a protective oxide layer which may be a perforated-like layer in the region of the fusible links to aid in the fusing thereof. The polycrystalline fusible links do not require a corresponding portion of the substrate area and are more easily fabricated and subsequently fused than prior art devices because the manufacturing processing for the fusible link is very similar to the manufacturing process for the rest of the semiconductor memory and the insulating layer provides a substantial thermal isolation between a fusible link and the substrate therebelow during fusing. The term "fusible" as employed herein refers to electrical energization of electrically continuous links resulting in said link becoming discontinuous electrically.

5 Claims, 6 Drawing Figures

POLY-CRYSTALLINE SILICON FUSIBLE LINKS FOR PROGRAMMABLE READ-ONLY MEMORIES

BACKGROUND OF THE INVENTION

1. Field of the Invention

This invention relates to the field of programmable circuits, and particularly to read-only memories of the field programmable type.

2. Prior Art

In a number of applications it is desired to have a circuit which may be permanently electronically altered, Typical examples are in computer memories where it is desired to permanently place certain information into the memory at some time subsequent to the fabrication of the memory. For instance, missiles may be build and deployed without knowledge of the eventual target for the missile. However, once the target is determined it may be desired to permanently alter a memory within the guidance system computer so as to permanently store the target coordinates. Other memory means such as flip-flop memories or magnetic memories are not suitable for this application since they may be subsequently inadvertently altered by such occurrences as a temporary loss in electrical power.

Another application where it may be desired to have a permanently alterable memory is in a digital computer which is to be used in conjunction with one or more analog devices. Analog devices characteristically require relatively large and/or relatively expensive components for the adjusting of such things as scale factors and biases. In some applications a less expensive and/or smaller package may be achieved if the analog devices are not accurately adjusted and such lack of adjustment is compensated for by permanently altering a memory within the digital computer after the computer and the analog devices are mated.

Another application where a permanently alterable memory may be highly advantageous is in special purpose digital computers. Rather than to build a different special purpose computer for each different application, it may be less expensive and easier to build general purpose computers of one design using permanently alterable memories. Each computer could later be permanently programmed for the desired special purpose thereby allowing high volume production of one fixed design even though each computer so produced will later be adapted to a specific use.

Permanently alterable memories have been build in the past using a semiconductor zener diode, or a pair of diodes in a back to back configuration. Typically, such circuits are altered by changing a diode from a unidirectional conducting device to a bi-directional conducting device by passing a current through the diode junction in a reverse bias direction. This current in the reverse direction causes severe heating of the PN junction and results in a permanent destruction of the PN junction characteristics. The resulting device is similar in characteristic to a resistor where the resistance is approximately equal to the combined resistance of the P and the N regions. Consequently, by the application of a relatively large current pulse, the diode may be effectably changed to a resistor having a substantial resistance. The zener diode approach described above, in the integrated circuit form, uses zener diodes formed in the silicon substrate as part of the integrated circuit and requires a very high current to fuse the junction due to its heat loss directly to the silicon substrate. The current needed to fuse such a device is generally in excess of 150 milliamps at 10 volts (power in excess of 1 ½watts). Driver circuitry needed to supply this amount of power is very costly both in silicon substrate area and speed of operation. Furthermore, due to the large power dissipated and the thermal conductivity of the substrate, devices formed in the silicon substrate near the fusing diode are subject to thermal damage. Thus, in summary, the zener diode approach requires a substantial amount of substrate area for the zener diodes themselves and a further substantial substrate area for the drivers required to fuse the diodes, thus making a high bit count integrated device impractical.

Another approach for programmable read-only memories is to deposit a nichrome fuse element which may be destroyed to program the memory. However, since nichrome has a relatively low resistivity it must be made very thin, typically less than 500 angstroms to fuse with a reasonable fusing current. After fusing, there is a possibility of reconstruction with time which negates the effect of the programming. Also it should be recognized that silicon deposition, doping and oxidation, and metallization processes using aluminum, gold and the like are standard processes used in integrated circuits fabrication, whereas the deposition of nichrome is a substantial departure from such processes, and as such, and because of the tight control required, is a relatively expensive process to incorporate as part of the integrated circuit fabrication production processes.

Consequently there is needed a programmable circuit, and specifically a read-only memory element which may be permanently altered with a relatively low and short term current pulse which does not occupy any significant substrate area and which may be fabricated by processes and techniques commonly regarded as conventional integrated circuit fabrication processes and techniques.

BRIEF SUMMARY OF THE INVENTION

Polycrystalline silicon fusible links for programmable circuits comprising polycrystalline silicon elements deposited to the top surface of an insulating layer over an integrated memory circuit, which may be connected in circuit by such means as a metallization layer. The polycrystalline fusible links may be deposited over a window etched through an insulating layer so as to be interconnected with the integrated circuit there-below or may be connected to the integrated circuit through a portion of the metallization layer. A protective layer may be used to protect the fusible link as well as the remainder of the integrated circuit. As an alternate embodiment, fusible links (polysilicon or nichrome or other suitable material) may be covered with a protective layer having windows over the narrow fusing portion of the fusible link to reduce the heat transfer therefrom, and to expose said link to an oxygen environment, thereby aiding in the fusing thereof. Thus, poly crystalline fusible links do not require a corresponding portion of the substrate area, and are more easily fabricated and subsequently fused than prior art devices because the manufacturing process of the fusible link is very similar to the proven manufacturing processes (e.g., silicon gate MOS processes) of the rest of the semiconductor circuits and the insula-ting layer provides a substantial thermal isolation between the fusible link and the substrate therebelow during fusing. Such fusible devices may be employed in diode, bi-polar, MOS or other component devices.

DETAILED DESCRIPTION OF THE INVENTION

The present invention is applicable to substantially any semiconductor circuit array on a common substrate for programmable circuits, whether such circuits are MOS, linear analog, bipolar or other types of devices. However, for purposes of explanation and by way of example only, the present invenion may be best described with reference to a particular, semiconductor array. Thus, in the discussion to follow, one particular semiconductor array is described in detail in regard to the circuitry, construction, programming and operation thereof, it being understood that the present invention is not to be limited to the specific embodiment described.

Figures 1, 2, 5:
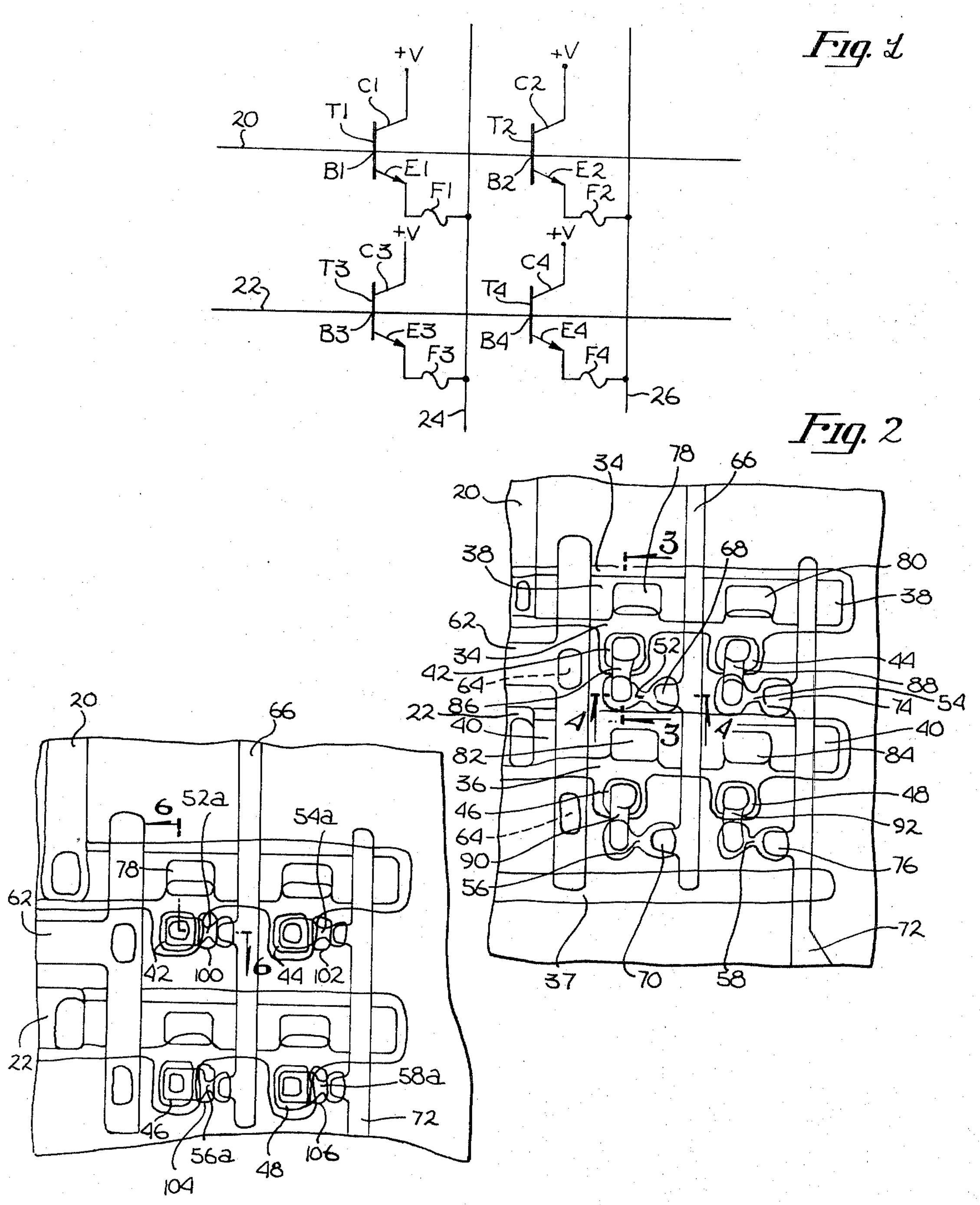
FIG. 1 is a schematic diagram of a typical memory circuit which may use a poly crystalline fusible link of the present invention.
FIG. 2 is a top view of an integrated circuit comprising the circuit shown schematically in FIG. 1.
FIG. 5 is a top view of an alternate integrated circuit comprising the schematic diagram of FIG. 1.

First referring to FIG. 1, a schematic of a four bit memory array may be seen. In this figure, four transistors T1, T2, T3 and T4 are arranged in a two by two matrix, and each have their collectors (C1 throuh C4) connected to the positive power supply terminals. The bases of the transistors in each row are connected to a common line. Thus, the bases B1 and B2 of transistors T1 and T2, respectively, are coupled to line 20, whereas bases B3 and B4 of transistors T3 and T4, respectively, are coupled to line 22. The emitters of the transistors in columns are coupled through fuses, that is, polycrystalline fusible links (to be hereinafter described in detail) to common lines. Thus, emitters E1 and E3 of transistors T1 and T3, respectively, are coupled to line 24 through fusible links F1 and F3, respectively, while emitters E2 and E4 of transistors T2 and T4 are coupled through fusible links F2 and F4, resprectively, to line 26.

The function of the above described circuit is as follows: The circuit is manufactured with fuses F1 through F4 intact and each coupling the respective emitter of the corresponding transistor to the common lines through a low resistance conduction path. Thus, whenever the base of a particular transistor is changed from the low state to the high state, the corresponding acts as an emitter follower, raising the corresponding vertical common lines to the high output state. (It is assumed that the vertical common lines, that is lines 24 and 26 in FIG. 1, are coupled to buffer circuitry having the characteristics of leaving lines 24 and 26 in the low state unless driven to the high state by the conduction of one of transistors T1 through T4 controlled by the base lines 20 and 22.) When line 20 is changed to the high state, both lines 24 and 26 will change to the high state because of conduction of transistors T1 and T2 through fuses F1 and F2, respectively. Consequently, the state of transistor T1, and particularly of fuse F1, may be read through line 24, and fuse F2 through line 26. To change the logical characteristic associated with any of the transistors (e.g., transistors T1 through T4) the corresponding base line 20 or 22 may be changed to the high state and the corresponding vertical line 24 or 26 retained in the lower state by suitable addressing and buffering circuitry well known in the prior art. Thus, by way of example, if line 20 is changed to the high state and line 24 is clamped in the low state, transistor T1 will be turned on, and substantially the full power supply voltage will be impressed across fuse F1. This will burn out fuse F1 resulting in an open circuit in place of the fuse. Consequently, in a subsequent read operation, when line 20 is in the high state line 24 will remain in the low state because of the opening of Fuse F1. Thus it may be seen that the logical output of any of the vertical lines 24 and 26 when any of the base lines 20 and 22 are changed to the high state is determined by the condition of the fuse coupled to the emitter of the transistor located at the junction of the corresponding two lines.

Figure 3:
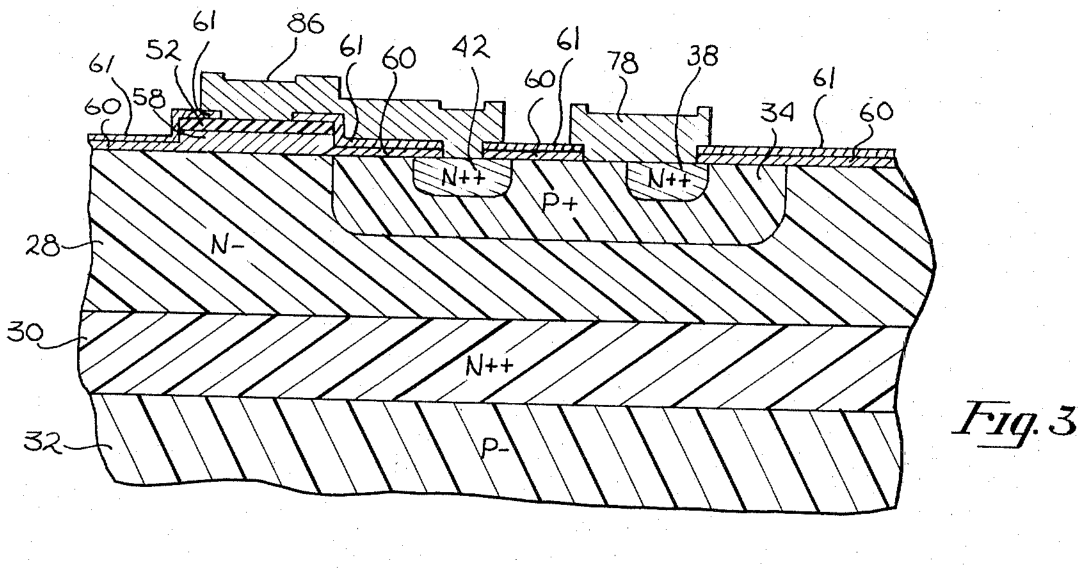
FIG. 3 is a cross section of the integrated circuit of FIG. 2 taken along lines 3—3 of that figure.
Figure 4:
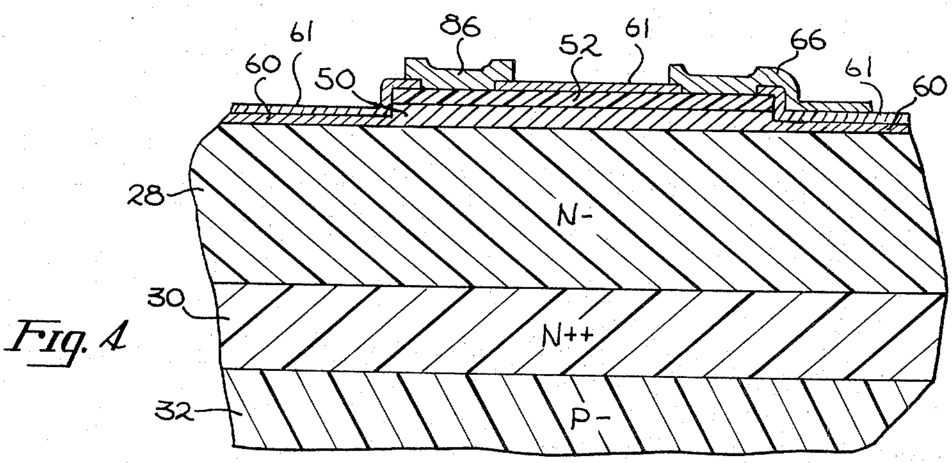
FIG. 4 is a cross section of the integrated circuit of FIG. 2 taken along lines 4—4 of that figure.

Now referring to FIGS. 2, 3 and 4, details of an integrated circuit comprising the schematic of FIG. 1 may be seen. FIG. 2 is a top view of the integrated circuit, FIG. 3 is a cross-section taken along the lines 3—3 of FIG. 2 and FIG. 4 is a cross-section taken along lines 4—4 of FIG. 2. In FIG. 2, as well as FIG. 5 to be subsequently discussed, the various regions diffused into the substrate as well as layers deposited on the surface of the substrate and buried by one or more silicon oxide layers, are shown. The definition of such regions is observable in an actual circuit due to the transparency of the oxide layers and the sharpness of the edge definition of the various regions.

the basic layer 28 into which various impurities are diffused so as to form the semi-conductor devices thereon is an N type epitaxial layer, and forms the collectors of all of the transistors of the circuit. The layer 28 is a relatively high resistivity layer, and to provide a low resistance connection of the layer to the positive power supply voltage, the layer has a buried N++ region of reduced resistivity 30, and a back surface or substrate P-region 32 for electrical connection to the negative power supply terminal. Thus, the PN junction between regions 32 and 30 is back biased, thereby electrically isolating the N-epitaxial layer 28.

Diffused into the top surface of the layer 28 are P+ regions 34 and 36, which form the common base connection for lines 20 and 22 respectively. (P+ region 37 (FIG. 2) provides electrical symmetry at the edge of the network.) In order to enhance the conductivity of these regions so as to assure equal potential among the various base regions connected to one of the common base lines, N++ regions 38 and 40 (FIG. 2) are diffused into the base regions 34 and 36, respectively, to provide a high conductivity interconnection of the base regions. N++ regions 42, 44, 46 and 48 are similarly diffused into the base regions 34 and 36 to form the emitters of the four transistors. These various regions comprise the doped regions diffused into the top surface of the layer 28 to provide the four transistors in the circuit of FIG. 1 and are further coupled in circuit by the polycrystalline fusible links of the present invention and various metallized regions.

Regions 38 and 40 (base conductivity enhancement regions) and regions 42, 44, 46 and 48 (emitter regions of transistors T1 through T4) may be diffused into the base regions 34 and 36 in a single diffusion step, using methods well known in the prior art of integrated circuit fabrication. Following that diffusion, an insulating layer is provided over the top surface of the substrate. Though in the preferred embodiment, the insulating layer is a silicon oxide layer thermally grown on the substrate, other insulating layers such as silicon nitride, by way of example, may be used, and such layers may be provided by well known deposition processes, such as, by way of example, vapor deposition. This layer, as shall be subsequently more fully described, forms both the electrically insulating layer between the polycrystalline fusible links and the substrate, and the thermal insulation layer between the links and the substrate. Therefore, the oxide layer, particularly for thermal reasons, should have a minimum thickness of at least 1000 angstroms. While this layer will subsequently be thinned in most areas, the layer will remain unaltered in the region under the fusible link, by way of example, in regions 58 and 50 in FIGS. 3 and 4. Following the growth of the oxide, a layer of polycrystalline silicon is deposited on the top of the oxide layer. The layer of silicon in the preferred embodiment is vapor deposited, and since the oxide layer on which it is deposited is amorphous, it is deposited as a polycrystalline layer. Doping of the polysilicon may be coincident with or subsequent to deposition of the polysilicon.

A second oxide (not shown) is then grown over the polycrystalline silicon, giving an oxide/polysilicon/oxide/silicon sandwich. The function of the second layer is to aid in the subsequent masking process. By known techniques, the top oxide layer is formed into a mask which is employed in a subsequent etching operation to form the polysilicon layer into the desired notched fusible links. Thus, the top silicon oxide layer and the polysilicon layer is removed from all regions of the substrate except those regions in which the notched polysilicon fusible links 52, 54, 56 and 58 are to be formed. As a final part of this step the oxide on top of the fuxible links is also removed. The entire surface of the wafer is then doped with an N or P type dopant. In the preferred structure, phosphorous is used in the form of $POCl_3$, forming a phosphorous glass layer 61 over the surface. This glass is primarily for passivation purposes and also prevents micro cracks in metal layers going across steps. This final dielectric sandwich is etched in selective regions so as to leave insulation coated regions generally covering the circuit, such as regions 60 as shown in FIGS. 3 and 4, but with windows therein exposing various areas of the circuit and of the polycrystalline silicon areas. Finally, a layer of conductive metal is deposited on the device and etched in a pattern so as to electrically interconnect the areas exposed through the windows in the desired manner. In particular, the metal area 62 forms the electrical contact for connection to the positive power supply terminal and contacts the N++ regions through appropriately disposed windows 64 in the oxide layer so as to make electrical contact with the N++ buried layer in the substrate (FIG. 2). A second metallized area 66 (FIG. 4) provides a common connection to fusible links 52 and 56 through windows in the oxide layer in regions 68 and 70, thereby forming the connection for line 20 in FIG. 1. A further metallized region 72 forms a common connection to fusible links 54 and 58 through windows in regions 74 and 76.

As previously stated, the N++ regions 38 and 40 have been provided to increase the conductivity of the base region so as to better provide an equal potential throughout the common bases. However, the PN junctions resulting between the N++ regions 38 and 40 and the base regions 34 and 36 is a non-functional and undesired junction. Therefore, additional metallized regions 78, 80, 82 and 84 are provided to bridge the N++ regions and the neighboring P+ regions in an area adjacent each of the transistors so as to provide an ohmic connection of the P and N regions, rather than a semiconductor junction connection. Also, as a result of the metallization and etching step, metallized regions 86 88, 90 and 92 are provided, each of which provides a connection through appropriately disposed windows in the oxide layer between the emitter and one end of the polycrystalline silicon fusible link. Thus, it may be seen that the resulting two by two array of the schematic of FIG. 1 has been readily achieved using common and very well known semi-conductor integrated circuit processing techniques, allowing the fabrication of devices encompassing the fusible links of the present invention with equipment and process controls currently in use by manufactures of other devices. Of course, the two by two array herein described is for purposes of example only, as is the specific logic elements used in plurality to construct the array, and very large arrays using the same or a different logic element circuit may readily be fabricated by those skilled in the art to achieve a programmable read-only memory utilizing the polycrystalline fusible links of the present invention, as shall be subsequently more fully described.

It should be noted that the polycrystalline links of the present invention have many advantages, not only over prior nichrome fusible links, but also over fusible links formed by doped regions of appropriate geometry and interconnection in the substrate. In particular, the placement of the fusible link on top of the oxide layer provides very substantial thermal isolation between the substrate and the fusible link, thereby allowing the fusing of the fusible link with far less energy than would be required if the fusible link were formed in the substrate. In this regard, it should be noted that the thermal conductivity of silicon oxide is on the order of 0.014 w/cm°C whereas the conductivity of silicon itself is on the order of 1.5v/cm°C. Furthermore, not only is the fusible link more easily fused in programming, but the heat resulting from the fusing is generally thermally insulated from the substrate therebelow, so that damage to components formed in the substrate as a result of the fusing may be readily avoided. This is to be compared with fusible links diffused directly into the substrate which require a high energy to fuse and which rapidly conduct the heat dissipated to adjacent components in the substrate, thereby requiring the careful separation of fusible links and other components to prevent damage thereto. Further, it should be noted that since the fusible links of the present invention are deposited or formed on the oxide layer covering the substrate, they may be placed in substantially any location over the substrate (except in those areas where metallization is required). Consequently, the fusible links do not themselves occupy any of the substrate area, and thus allow a denser layout of logic devices on the substrate. This, coupled with a reduction in the current capacity of the buffer circuitry normally located on the substrate surrounding the memory array allows the layout of a semiconductor memory on a given substrate size which has a greater capacity than achieved using prior art techniques. Further, this result has been achieved without the use of any processes foreign to anyone familiar with the fabrication of any integrated circuit.

It should be noted that a further reduction in the energy required to fuse the links of the present invention may be achieved by providing openings or windows in the final oxide layer in the regions covering the fusing part of the fusible links, that is, the narrow area of the fusible links between the two metallized connections thereto. In addition this window enables the fusible link to be exposed to an oxygen environment which substantially facilitates fusing. All of this further reduces the heat loss from the top surface of the fusible link during fusing and results in a further substantial reduction in the energy required to fuse the links. Since the final oxide layer over the fusible link is primarily a scratch resistant layer, and a substrate is most subject to abrasion around the edges thereof where the terminal pads and buffer circuitry is located, rather than near the center where the memory array and fusible links will be located, such openings in the oxide layer in the region of the fusible links will not substantially detract from the overall scratch resistant characteristics of the integrated circuit.

Now referring to FIG. 5, a top view of an alternate embodiment for the construction of the circuit in FIG. 1 may be seen. In this embodiment, the area identified by the two-digit numerals correspond in construction and function to the same areas identified in the embodiment of FIG. 2, and attention is directed to the prior discussion thereof for a detailed explanation of these areas. The embodiment of FIG. 5, however, has two substantial differences from the embodiment of FIG. 2. Specifically, the fusible links **52*a*, 54*a*, 56*a* and 58*a*, instead of being coupled to the emitters of the respective transisitors through the metallized regions 86, 88, 90 and 92, are disposed immediately over the respective emitter regions 42, 44, 46 and 48 and make electrical contact thereto through appropriately disposed windows in the oxide layer. Thus, the fusible links 52*a*, 54*a*, 56*a* and 58*a* directly couple the emitter regions of transistors T1 through T4 to the appropriate ones of metallized areas 66 and 72. (As a further alternate embodiment, the fusible links could be coupled between areas in the substrate, depending on the circuit design, by a pair of spaced apart windows in the oxide layer.) The windows, generally indicated by the lines 100, 102, 104 and 106** are disposed immediately over the narrow portion of the fusible links. Thus, when fusing current is applied to the fusible link, the narrow portion of the link will heat rapidly to the fusing temperature because of the higher resitance in the narrower section, and further, in this embodiment because of the reduced heat transfer from the top surface of each of the fusible links.

Figure 6:
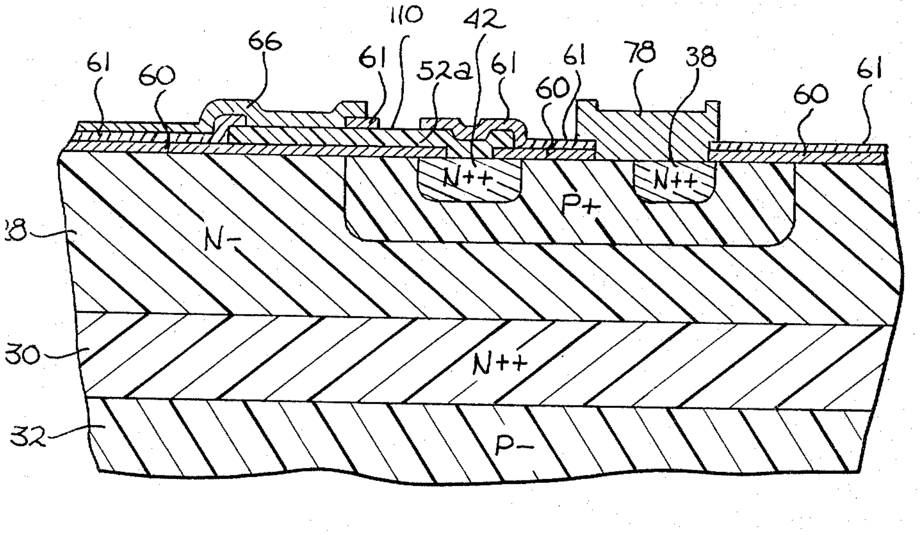
FIG. 6 is a cross section of the integrated circuit of FIG. 5 taken along lines 6—6 of that figure.

Now referring to FIG. 6, a cross section of the embodiment of FIG. 5 taken along lines 6—6 of that figure may be seen. In this figure, the various areas diffused into the substrate are identical with those of FIG. 3. It may be seen that the fusible link **52*a* is disposed so as to contact the emitter region 42 through a window in the lower oxide layer 60, and extends to a position so as to be contacted above through a window in an upper oxide layer by the metallized region 66. Also visible in this cross section is a length of the fusible link 52*a* which is not covered by an oxide or metallized layer, generally indicated by the numeral 110**, which, as previously described, allows the fusing of the fusible link at an even further reduced power level.

As previously mentioned, the present invention may be used in conjunction with other types of circuit components such as field effect devices (MOS devices, etc.) When used with such devices, the processing for fabrication may be substantially that described in a U. S. Pat. entitled "Integrated Circuit Structure and Method For Making Integrated Circuit Structure", U. S. Pat. No. 3,699,646 issued Oct. 24, 1972, and assigned to the same assignee as the present invention. More particularly, the fusible links may be formed so as to make direct contact with one or more regions diffused into the substrate, typically the source or the drain, in the same manner as is shown in FIG. 6 with regard to bipolar circuits. Thus, a thick oxide is etched away in the area for the source gate and drain of the MOS device to be formed, and a thin oxide layer is then provided over this exposed area of substrate. One or more windows are then etched through the thin oxide, a layer of generally polycrystalline silicon is deposited thereover and a subsequent oxide layer is provided. (The above steps provide contact of the polysilicon layer with the region of the substrate which will subsequently be the source or drain regions.) The device is then etched to remove portions of the outer oxide and polysilicon layers so as to expose certain source and drain regions, to define the gates, the fusible links and circuit interconnections, as desired. The resulting substrate has certain source and drain regions exposed through windows in the oxide layer and the source in the drain regions may then be diffused, (diffusion under and into the adjacent edge of the polysilicon layer enhances the electrical contact therewith), with a re-oxidation cycle thereafter. As before, the substrate is then coated with the $POCl_3$. Windows are then etched in the glass and thin oxide layers so as to expose the desired regions thereunder, and a final metallization layer is provided for making the metallized circuit interconnection as desired. Thus, it may be seen that the same process which is used to form the gate of the field effect device is simultaneously used to form the poly-crystalline silicon fusible link of the present invention.

As a result of the present invention, programmable read-only memories may be fabricated with high component density using ordinary semiconductor fabrication techniques. To take maximum advantage of the unique characteristics of the present invention, certain parameters for the fusible link have been found to be important and should be controlled within certain limits so as to result in the most desirable operating characteristics. As previously described, the fusible link preferably has a short, narrow section between the two ends thereof so as to define a region of highest resistance and greatest susceptability to fusing. It has been found that the width of this notch is presently preferably between one and three microns. Below one micron notch width the fabrication control is such that some fuses will be open or nearly open prior to fusing, and will not be reliable in normal operation. On the other hand, a notch width of greater than three microns tends to make programming difficult.

It has also been found that the thickness of a polycrystalline silicon layer is presently preferably 2,800 angstroms and 4,000 angstroms. Silicon thickness greater than 4,000 angstroms writability and deteriorating aluminum step coverage in the metallization layer. If the thickness is less than 2,800 angstroms, the fuse resistance is subject to wide variation. In addition, the ohmic contact of the polycrystalline silicon to the substrate must be good in order to adequately and reliably write. Rectifying aluminum-polysilicon contacts are caused by excessive alloying, doping level and/or an excessively thin poly silicon layer (less than 2,800 angstroms). These parameters effect writability and/or reliability and repeatability, both in the manufacturing processes and in subsequent use of the fusible links. Of course, the thickness of the insulating layer, characteristically silicon oxide, also has a significant effect on the power loss from the fuse, and therefore on the power required for fusing. An oxide layer having a thickness of approximately 4,100 angstroms was chosen for the insulating layer when used with bipolar memory circuits due to its compability with the existing bipolar process. Of course, a thicker oxide, such as approximately one micron thick, would significantly further reduce the writing power.

Thus the present invention has been described herein in substantial detail with reference to only one particular basic memory circuit, and with reference to two basic embodiments thereof. It is to be understood, however, that many different basic field programmable memory circuits using fuses of some sort are well known in the prior art, and that the present invention may be readily adapted by one skilled in the art for use with such circuits. Thus, while the invention has been particularly shown and described with reference to preferred embodiments thereof, it will be understood by those skilled in the art that various changes in form and detail may be made therein without departing from the spirit and scope of the invention.

I claim:

1. A semiconductor read only memory comprising a monocrystalline silicon substrate having a first conductivity type and having a plurality of active devices formed therein; a layer of silicon oxide over said substrate having a thick portion, said thick portion having a thickness of at least approximately 1,000 angstroms; a fusible polycrystalline silicon member formed with a substantial portion thereof overlying said thick portion of said silicon oxide and being coupled in circuit to said active element, said polycrystalline silicon member having a thickness in the range of approximately 2,800 to 4,000 angstroms and containing impurities to assist in enabling said polycrystalline silicon member to open circuit upon the passage of a fusing current therethrough and having a reduced section parallel to the surface of said substrate with a width in the range of approximately 1 to 3 microns; a protective layer over a portion of said semiconductor read only memory having at least one window formed therein to expose at least said reduced section of said fusible member to expose said reduced section to an oxygen bearing environment and a conductive member formed in part over said protective layer and connected to said fusible polycrystalline silicon member through an opening in said protective layer.

2. A semiconductor read only memory defined in claim 1 wherein said active devices comprise devices formed in said substrate having a first region of a conductivity type opposite to said substrate and a second region formed within said first region of a conductivity type opposite to said first region.

3. A semiconductor read only memory defined in claim 1 wherein said polycrystalline silicon member is directly connected to said active element.

4. A semiconductor read only memory defined in claim 1 wherein said reduced section has a notched configuration.

5. A semiconductor read only memory defined in claim 1 wherein a plurality of windows are included in said protective layer and said protective layer covers a substantial portion of said read only memory, and wherein said reduced section and windows therefor are positioned away from the periphery of the memory to minimize damaging said fusible member while said periphery of said memory is substantially covered by said protective layer excepting areas where electrical contacts are to be made.

* * * * *